United States Patent
Iguchi et al.

(10) Patent No.: US 7,095,093 B2
(45) Date of Patent: Aug. 22, 2006

(54) SEMICONDUCTOR DEVICE AND METHOD OF MANUFACTURING A SEMICONDUCTOR DEVICE

(75) Inventors: Tadashi Iguchi, Yokkaichi (JP); Hiroaki Tsunoda, Yokkaichi (JP); Koichi Matsuno, Mie-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/839,140

(22) Filed: May 6, 2004

(65) Prior Publication Data

US 2004/0207039 A1   Oct. 21, 2004

Related U.S. Application Data

(63) Continuation of application No. 10/180,463, filed on Jun. 27, 2002, now abandoned.

(30) Foreign Application Priority Data

Jun. 29, 2001   (JP) ............... 2001-198571

(51) Int. Cl.
*H01L 29/00*   (2006.01)
(52) U.S. Cl. .............. 257/510; 257/506; 438/294
(58) Field of Classification Search ........... 257/510, 257/513–514, 315–319, 338, 622; 438/296
See application file for complete search history.

(56) References Cited

U.S. PATENT DOCUMENTS

| | | | |
|---|---|---|---|
| 5,434,109 A | 7/1995 | Geissler et al. | |
| 5,578,518 A | 11/1996 | Koike et al. | |
| 5,956,598 A | 9/1999 | Huang et al. | |
| 6,091,129 A | 7/2000 | Cleeves | |
| 6,100,132 A * | 8/2000 | Sato et al. | 438/243 |
| 6,124,184 A | 9/2000 | Jeong | |
| 6,130,453 A | 10/2000 | Mei et al. | |
| 6,143,624 A | 11/2000 | Kepler et al. | |
| 6,281,103 B1 | 8/2001 | Doan | |
| 6,326,255 B1 | 12/2001 | Ishitsuka et al. | |
| 6,333,232 B1 | 12/2001 | Kunikiyo | |
| 6,399,992 B1 | 6/2002 | Matsumoto et al. | |
| 6,500,726 B1 * | 12/2002 | Lee et al. | 438/424 |
| 6,559,027 B1 | 5/2003 | Ishitsuka et al. | |

(Continued)

FOREIGN PATENT DOCUMENTS

EP   0491975 A1   12/1990

(Continued)

*Primary Examiner*—Nathan J. Flynn
*Assistant Examiner*—Ahmed N. Sefer
(74) *Attorney, Agent, or Firm*—Finnegan, Henderson, Farabow, Garrett & Dunner, L.L.P.

(57) ABSTRACT

A semiconductor device comprises a semiconductor substrate having a substrate top surface on which a device should be formed; a gate electrode having an opposed surface opposed to said substrate top surface, and electrically insulated from said semiconductor substrate by a gate insulating film, a trench formed through said gate electrode into said semiconductor substrate to electrically isolate a device region for forming a device from the remainder region of said substrate top surface, a first boundary end portion, which is defined between a substrate side surface of said semiconductor substrate forming a part of the side surface of said trench and said substrate top surface, and a second boundary end portion, which is defined between a gate side surface of said gate electrode forming another part of the side surface of said trench and said opposed surface, wherein said first boundary end portion and said second boundary end portion have spherical shapes having a curvature radius not smaller than 30 angstrom.

4 Claims, 6 Drawing Sheets

U.S. PATENT DOCUMENTS

| | | |
|---|---|---|
| 6,566,224 B1 | 5/2003 | Chang et al. |
| 2001/0032996 A1 | 10/2001 | Inoue |
| 2002/0020867 A1 | 2/2002 | Shiozawa et al. |
| 2002/0045324 A1 | 4/2002 | Ding |
| 2002/0055217 A1 | 5/2002 | Kanamori |
| 2002/0106906 A1 | 8/2002 | Ballantine et al. |
| 2002/0115270 A1 | 8/2002 | Wu |
| 2002/0197823 A1* | 12/2002 | Yoo et al. .................... 438/424 |
| 2003/0042539 A1* | 3/2003 | Lee et al. .................... 257/330 |
| 2003/0057484 A1 | 3/2003 | Sonoda et al. |
| 2003/0060019 A1 | 3/2003 | Sridhar et al. |
| 2003/0119276 A1 | 6/2003 | Ishitsuka et al. |

FOREIGN PATENT DOCUMENTS

| | | | |
|---|---|---|---|
| JP | 05-55156 | | 3/1993 |
| JP | 06-314777 | | 11/1994 |
| JP | 10-242264 | | 9/1998 |
| JP | 11-233617 | * | 8/1999 |
| JP | 11-251581 A | | 9/1999 |
| JP | 11-260906 | | 9/1999 |
| JP | 11-274288 | | 10/1999 |
| JP | 2000-150630 | | 5/2000 |
| JP | 2000-315738 | * | 11/2000 |
| JP | 2003-45957 | * | 2/2003 |
| KR | 1992-13621 | | 7/1992 |
| KR | 0122513 | | 11/1997 |
| KR | 10-2001-0048675 | | 6/2001 |

* cited by examiner

SEMICONDUCTOR DEVICE AND METHOD OF MANUFACTURING A SEMICONDUCTOR DEVICE

This is a continuation of application Ser. No. 10/180,463, filed Jun. 27, 2002, which is incorporated herein by reference.

CROSS-REFERENCE TO RELATED APPLICATIONS

This application is based upon and claims the benefit of priority from the prior Japanese Patent Application No. 2001-198571, filed on Jan. 29, 2001, the entire contents of which are incorporated herein by reference.

BACKGROUND OF THE INVENTION

1. Field of the Invention

This invention relates to a semiconductor device and its manufacturing method, and more particularly to a semiconductor device having device isolation by STI and its manufacturing method.

2. Related Background Art

For the purpose of downsizing semiconductor devices, the method of isolating devices by STI (Shallow Trench Isolation) has been used for years in lieu of the technique using selective oxidation for isolating devices. STI is a technique for electrically insulating device regions forming devices from other regions in a semiconductor device by making trenches. In STI, trenches are formed in device isolating regions instead of selective oxidation thereof.

Figure 8:
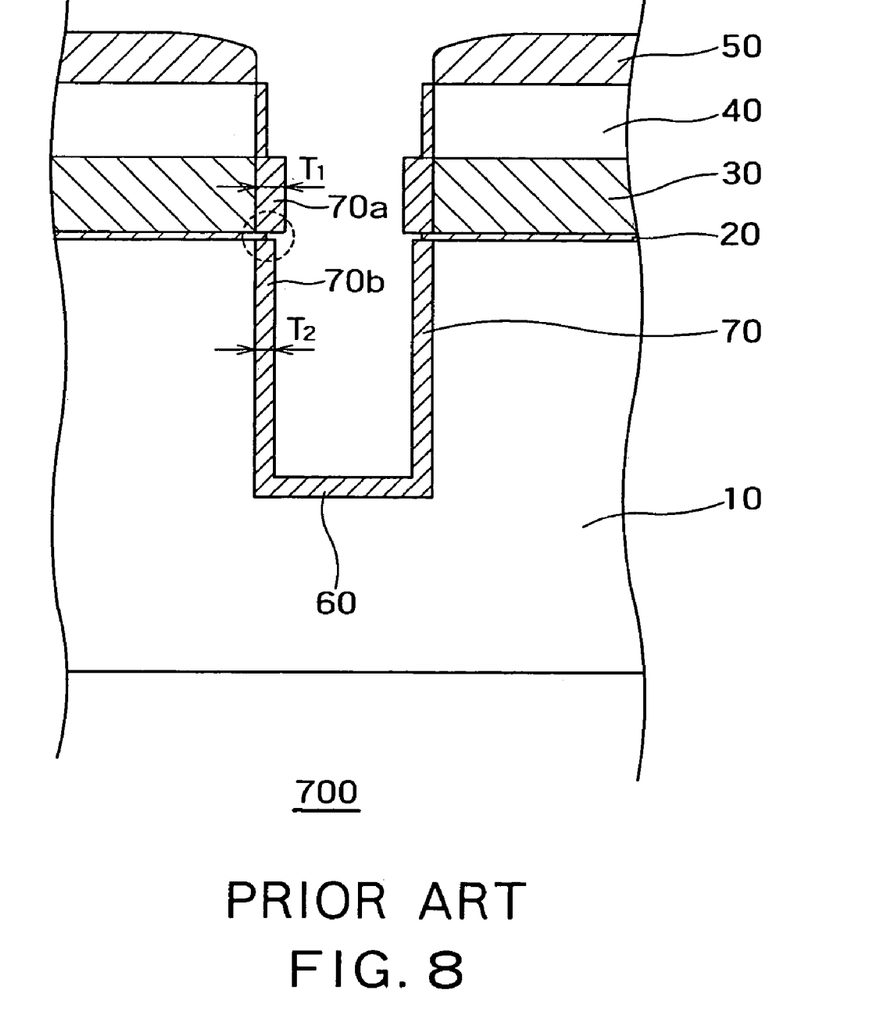
FIG. 8 is an enlarged cross-sectional view of a conventional semiconductor device 700 having STI under a manufacturing process thereof.

FIG. 8 is an enlarged cross-sectional view of a semiconductor device 700 having conventional STI under a process of its manufacturing. A gate insulating film 20 is formed on the top surface of a semiconductor substrate 10. A gate electrode 30 in form of an amorphous silicon film overlies the gate insulating film 20. A silicon nitride film 40 is deposited on the gate electrode 30. A silicon oxide film 50 is deposited on the silicon nitride film 40.

The silicon nitride film 40 and the silicon oxide film 50 are selectively removed by etching into a predetermined pattern by photolithography. After that, using the silicon oxide film 50 as a mask, the gate electrode 30, the gate insulating film 20 and the semiconductor substrate 10 are selectively removed by etching. In this etching, the trench 60 is formed to dig into the semiconductor substrate 10.

Subsequently, the side and bottom surface portions of the trench 60 are oxidized by RTO (rapid thermal oxidation) in an oxygen $O_2$ atmosphere held at 1000° C. In FIG. 8, the trench 60 and the surrounding structure after RTO treatment are shown in an enlarged scale.

On the side surface and the bottom surface of the trench 60, a silicon oxide film 70 is formed by RTO. The silicon oxide film 70 protects the semiconductor substrate 10, etc.

In general, the diffusion coefficient of an oxidation seed is smaller when diffusing into silicon single crystal used as a semiconductor substrate exhibit than when diffusion into amorphous silicon.

Therefore, in the oxidation process by RTO, thickness $T_2$ of the silicon oxide film 70b formed on silicon single crystal used as the semiconductor substrate 10 is thinner than the thickness $T_1$ of the silicon oxide film 70a formed on the gate electrode 30.

Either in silicon single crystal or amorphous silicon, end portions like sides or corners located at boundaries of two planes receive a larger stress than flat surface portions as the oxidation progresses. To such end portions of silicon single crystal or amorphous silicon, the oxide seed is difficult to diffuse. Therefore, there occurs the phenomenon in which planar surfaces of silicon single crystal or amorphous silicon are more easily oxidized whereas end portions of that are difficult to oxidize.

Figure 2A:
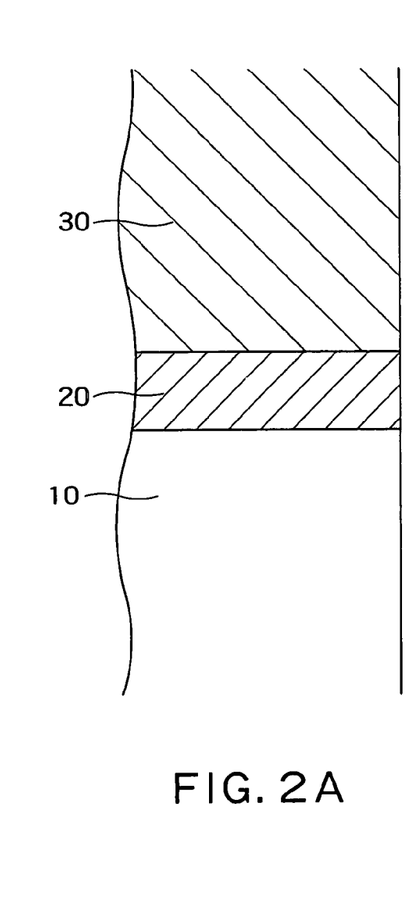
FIG. 2A is an enlarged cross-sectional view of an end portion of a semiconductor substrate and an end portion of a gate electrode before oxidation processing by RTO.
Figures 2B, 2C:
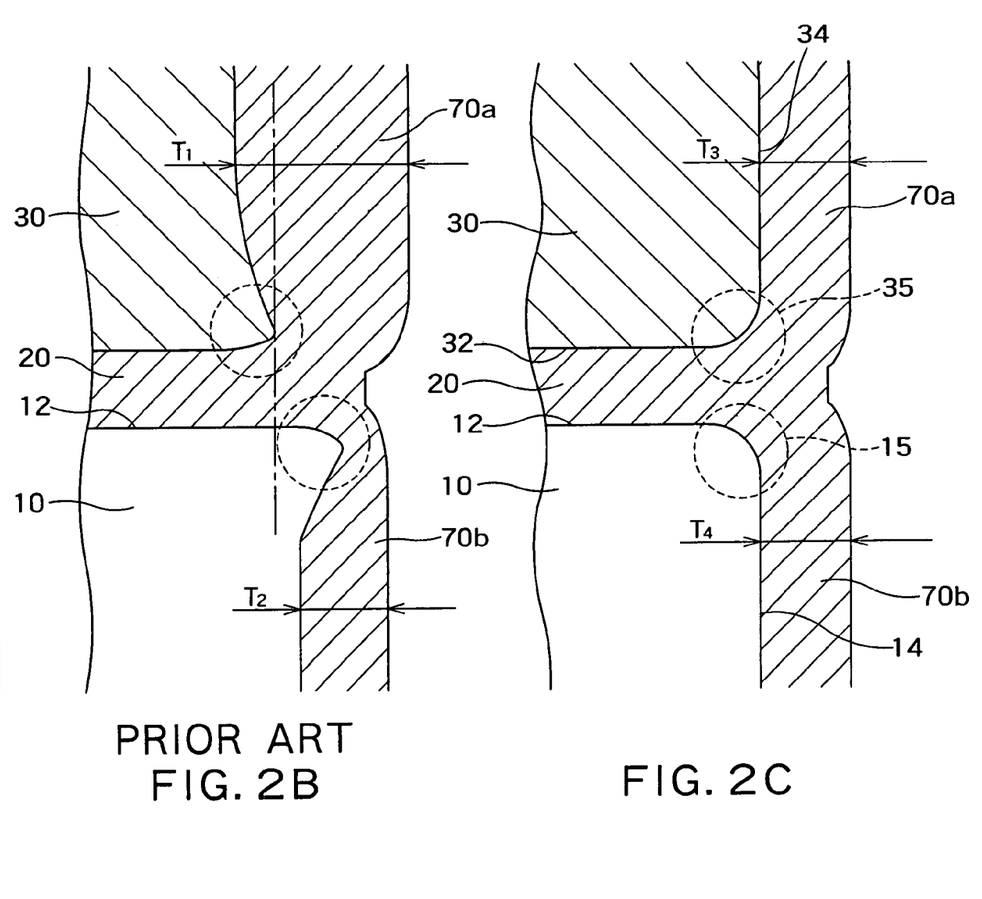
FIG. 2B is an enlarged cross-sectional view of an end portion of a semiconductor substrate and an end portion of a gate electrode in a conventional semiconductor device after oxidation processing by RTO.
FIG. 2C is an enlarged cross-sectional view of an end portion of the semiconductor substrate and an end portion of the gate electrode in the semiconductor device according to the embodiment of the invention after oxidation processing by RTO.

FIG. 2B is an enlarged cross-sectional view of an end portion of a semiconductor substrate and an end portion of a gate electrode that are encircled by a broken line circle in FIG. 8. Since the end. portion of the semiconductor substrate 10 and the end portion of the gate electrode 30 are more difficult to oxidize than flat surfaces, the oxide film formed on the semiconductor substrate 10 and the gate electrode 30 become thinner and thinner toward their end portions than the thickness on their flat surfaces. As a result, the end portion of the semiconductor substrate 10 and the end portion of the gate electrode 30 are sharpened (see the inside of the broken line circle of FIG. 2B). The shaper the end portions of the semiconductor substrate 10 and the gate electrode 30, the larger the stress applied thereto. Thus the electric field is liable to concentrate at the end portions.

In addition, since the silicon oxide film 70b is thinner than the silicon oxide film 70a, the end portion of the gate electrode 30 overlaps a flat portion of the substrate top surface 12 when viewed from a vertical direction relative to the substrate top surface 12 of the semiconductor substrate 10 (see the dot-and-dash line in FIG. 2B).

As the stress to the gate electrode 30 and the gate insulating film 20 becomes larger, electrons trapped in the gate insulating film 20 increase (hereinafter called trapped electrons). The increase of the trapped electrons causes fluctuation of the threshold voltage (see FIG. 6).

Fluctuation of the threshold voltage prevents normal operation of the semiconductor device 700. In case the gate electrode 30 is used as the floating gate electrode of a memory, those defects often decreases the possible frequency of write and erase operation (hereinafter called W/E endurance characteristics) (see FIG. 7).

Furthermore, when viewed from a direction vertical to the substrate top surface 12 of the semiconductor substrate 10, since the end portion of the gate electrode 30 liable to gather the electric field overlaps a flat portion of the substrate top surface 12, the resistance voltage of the gate in the semiconductor device 700 undesirably decreases.

SUMMARY OF THE INVENTION

According to an embodiment of the invention, there is provided a semiconductor device comprising: a semiconductor substrate having a substrate top surface on which a device should be formed, a gate electrode having an opposed surface opposed to the substrate top surface, and electrically insulated from the semiconductor substrate by a gate insulating film, a trench formed through the gate electrode into the semiconductor substrate to electrically isolate a device region for forming a device from the remainder region of the substrate top surface, a first boundary end portion, which is defined between a substrate side surface of the semiconductor substrate forming a part of the side surface of the trench and the substrate top surface, and a second boundary end portion, which is defined between a gate side surface of the gate electrode forming another part of the side surface of the trench and the opposed surface, wherein said first boundary end portion and said second boundary end portion have spherical shapes having a curvature radius not smaller than 30 angstrom According to a further embodiment of the invention, there is provided a semiconductor device comprising: a semiconductor substrate having a substrate top surface on which a device should be formed; a gate electrode having an opposed surface opposed to the substrate top surface, and electrically insulated from the semiconductor substrate by a gate insulating film, a trench formed through the gate electrode into the semiconductor substrate to electrically isolate a device region for forming a device from the remainder region of the substrate top surface, a first boundary end portion, which is defined between a substrate side surface of the semiconductor substrate forming a part of the side surface of the trench and the substrate top surface, and a second boundary end portion, which is defined between a gate side surface of the gate electrode forming another part of the side surface of the trench and the opposed surface, wherein said first boundary end portion overlaps said second boundary end portion when they are viewed from a direction vertical to the substrate top surface.

According to a still further embodiment of the invention, there is provided a semiconductor device manufacturing method comprising: forming a gate insulating film on a semiconductor substrate; forming a gate electrode on the gate insulating film to be electrically insulated from the semiconductor substrate; etching the gate electrode, the gate insulting film and the semiconductor substrate to form a trench which electrically isolate a device region for forming a device from the remainder region on the substrate top surface; and oxidizing a substrate side surface of the semiconductor substrate, which forms a part of the side surface of the trench, and a gate side surface of the gate electrode, which forms another part of the side surface of the trench, in a hydrogen $H_2$ and oxygen $O_2$ atmosphere.

According to a yet further embodiment of the invention, there is provided a semiconductor device manufacturing method comprising: forming a gate insulating film on a semiconductor substrate; forming a gate electrode on the gate insulating film to be electrically insulated from the semiconductor substrate; etching the gate electrode, the gate insulting film and the semiconductor substrate to form a trench which electrically isolate a device region for forming a device from the remainder region on the substrate top surface; and oxidizing a substrate side surface of the semiconductor substrate, which forms a part of the side surface of the trench, and a gate side surface of the gate electrode, which forms another part of the side surface of the trench, in an ozone $O_3$ atmosphere.

DETAILED DESCRIPTION OF THE INVENTION

An embodiment of the invention will be explained below with reference to the drawings. The embodiment, however, should not be construed to limit the invention.

Figure 1A:
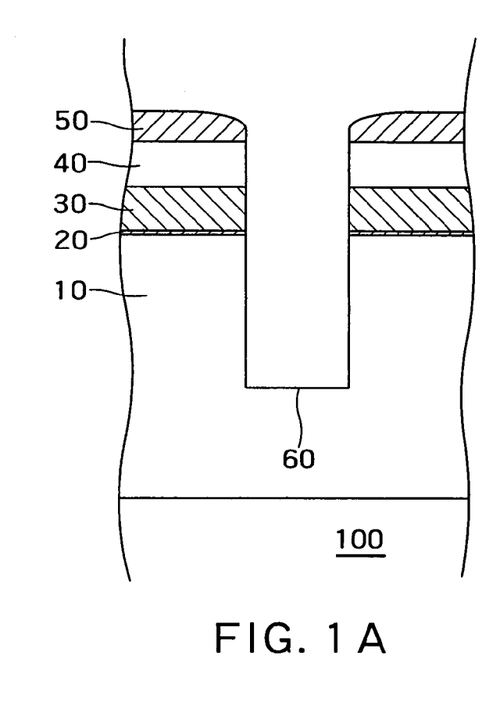
FIG. 1A is an enlarged cross-sectional view of a trench and its surrounding structure in a semiconductor device 100 having STI according to an embodiment of the invention.
Figure 1B:
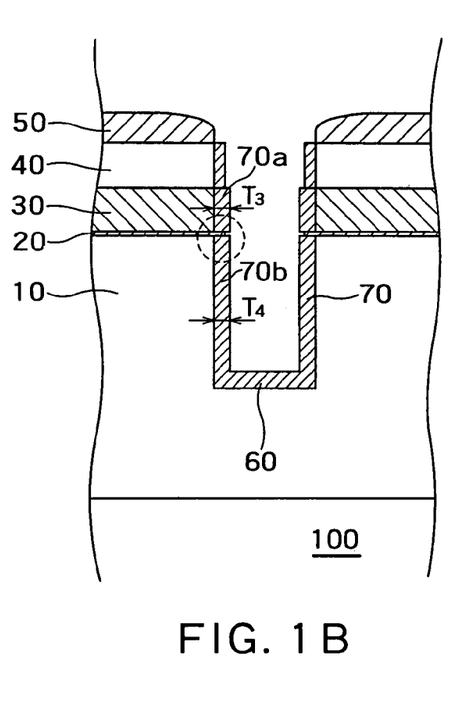
FIG. 1B is an enlarged cross-sectional view of the trench and its surrounding structure in the semiconductor device 100 after the manufacturing process of FIG. 1A.
Figure 1C:
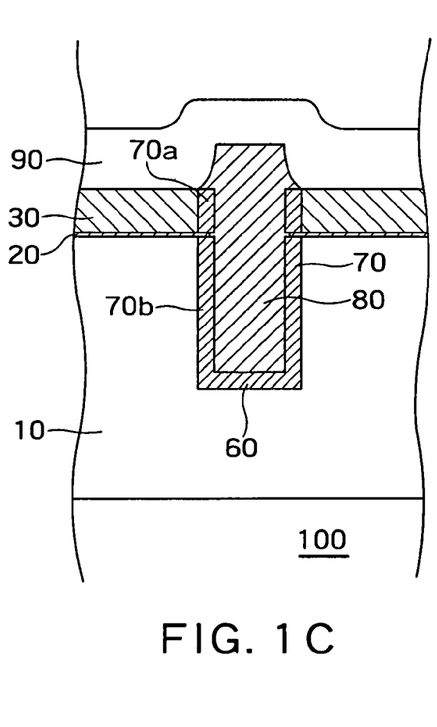
FIG. 1C is an enlarged cross-sectional view of the trench and its surrounding structure in the semiconductor device 100 after the manufacturing process of FIG. 1B.

FIGS. 1A, 1B and 1C are enlarged cross-sectional views of a trench and its surrounding structure in a semiconductor device 100 having STI according to an embodiment of the invention. The semiconductor device 100 is manufactured in the order of FIG. 1A, FIG. 1B and FIG. 1C.

First referring to FIG. 1A, formed on the top surface of a semiconductor substrate 10 is a gate insulating film 20 in form of a silicon oxide film, approximately 10 nm thick, for example. Formed on the gate insulating film 20 is a gate electrode 30 in form of an amorphous silicon film, approximately 60 nm thick, for example. Deposited on the gate electrode 30 is a silicon nitride film 40. Deposited on the silicon nitride film 40 is a silicon oxide film 50.

The silicon nitride film 40 and the silicon oxide film 50 are selectively etched into a predetermined pattern by using photolithography. After that, using the silicon oxide film 50 as a mask, the gate electrode 30, gate insulating film 20 and semiconductor substrate 10 are selectively removed by etching. In this etching, a trench 60 is formed to pass through the gate electrode 30 and the gate insulating film 20 and reach to the semiconductor substrate 10.

Subsequently, as shown in FIG. 1B, the side and bottom surface portions of the trench 60 are oxidized by RTO in an atmosphere containing hydrogen $H_2$ and oxygen $O_2$ held at approximately 1000° C. FIG. 1B shows the trench 60 and its surrounding structure after oxidation in the hydrogen $H_2$ and oxygen $O_2$ atmosphere in an enlarged cross-sectional view. Thickness $T_3$ of the oxide film formed along the side surface of the semiconductor substrate 10 and thickness $T_4$ of the oxide film formed along the side surface of the gate electrode 30 are substantially equal. In case of this embodiment, thickness $T_3$ and thickness $T_4$ were approximately 6 nm.

After that, as shown in FIG. 1C, a silicon oxide material 80 is deposited to bury the trench 60 by using the HDP (high density plasma) technique. Then the silicon oxide material 80 is smoothed by CMP, and the semiconductor substrate 10 is thereafter heated in a nitrogen atmosphere held at approximately 900° C. After the semiconductor substrate 10 is next exposed to NH$_4$F solution, the silicon nitride film 40 is removed by phosphation at approximately 150° C. Thereafter, doped polysilicon 90 containing phosphor is deposited on the silicon oxide material 80 and the gate electrode 30 by low-pressure CVD.

Through some further steps, the semiconductor device 100 having device isolation by the trench 60 is completed.

FIG. 2A is an enlarged cross-sectional view of an end portion of the semiconductor substrate 10 and an end portion of the gate electrode 30 in the semiconductor device 100 or 700 before oxidation processing by RTO. FIG. 2B is an enlarged cross-sectional view of an end portion of the semiconductor substrate 10 and an end portion of the gate electrode 30 in the conventional semiconductor device 700 after oxidation processing by RTO. FIG. 2C is an enlarged cross-sectional view of an end portion of the semiconductor substrate 10 and an end portion of the gate electrode 30 in the semiconductor device 100 according to the embodiment of the invention after oxidation processing by RTO.

The end portion of the semiconductor substrate 10 and the end portion of the gate electrode 30 encircled by broken line circles in FIG. 1B appear in FIG. 2C in an enlarged scale.

As shown in FIG. 2C, the semiconductor device 100 according to the embodiment is electrically insulated from the semiconductor substrate, and includes the gate electrode 30 having an opposed surface 32 facing to the substrate surface 12 of the semiconductor substrate 10, and the trench 60 penetrating the gate electrode 30 and extending into the semiconductor substrate 10. The gate insulating film 20 is formed between the semiconductor substrate 10 and the gate electrode 30 to electrically insulate them.

The semiconductor substrate 10 is made of, for example, silicon single crystal. The gate insulating film 20 may be, for example, a silicon oxide film formed by oxidizing the semiconductor substrate 10. The gate electrode 30 is formed by depositing amorphous silicon, for example.

A silicon oxide film 70$a$ is formed on the substrate side surface 14 of the semiconductor substrate 10 by RTO, and a silicon oxide film 70$b$ is formed on the gate side surface 34 of the gate electrode 30. In this embodiment, thickness $T_3$ of the silicon oxide film 70$a$ and thickness $T_4$ of the silicon oxide film 70$b$ are approximately equal.

In case the oxidation of the side surface and the bottom surface of the trench 60 is carried out in an oxygen O$_2$ (dry oxygen) atmosphere as the conventional technique did, the diffusion coefficient of the oxidation seed is relatively small. Especially, the oxidation seed exhibits a smaller diffusion coefficient when diffusing into silicon single crystal than when diffusing into amorphous silicon. Therefore, as shown in FIG. 2B, thickness $T_2$ of the silicon oxide film 70$b$ becomes thinner than thickness $T_1$ of the silicon oxide film 70$a$.

In the embodiment of the invention, oxidation of the side surface and the bottom surface of the trench 60 is carried out in a hydrogen H$_2$ plus oxygen O$_2$ atmosphere. In this case, the oxidation seed exhibits a larger diffusion coefficient than conventional one. The increase of the diffusion coefficient for diffusion into silicon single crystal is especially great as compared with the increase of the diffusion coefficient for diffusion into amorphous silicon. Therefore, the difference in oxidation speed between silicon single crystal and amorphous silicon is diminished, and it results in substantially equalizing the thickness $T_3$ of the silicon oxide film 70$a$ and the thickness $T_4$ of the silicon oxide film 70$b$.

In the instant embodiment, oxygen radicals are generated by inviting interaction of hydrogen H$_2$ and oxygen O$_2$ by RTO under a high temperature, and the oxygen radicals serve as the oxidation seed. However, also when using O$_3$ (ozone) in lieu of hydrogen H$_2$ and oxygen O$_2$ for oxidation, the same configuration as the semiconductor device 100 according to the instant embodiment can be obtained.

In this embodiment, since the diffusion coefficient of the oxidation seed becomes relatively larger, oxidation is promoted at the end portion of the semiconductor substrate 10 and the end portion of the gate electrode 30 that are subjected to a stress. Therefore, in the semiconductor device 100 according to the instant embodiment, the end portion of the semiconductor substrate 10 and the end portion of the gate electrode 30 are not sharp or beveled unlike those of the conventional device.

In the semiconductor device 100 according to the instant embodiment, the boundary end portion 15 of the semiconductor substrate 10 defined between the substrate side surface 14 forming a part of the side surface of the trench 60 and the substrate top surface 12, and the boundary end portion 35 of the gate electrode 30 defined between the gate side surface 34 forming a part of the trench 60 and the opposed surface 32, are rounded into a spherical form having a curvature radius not smaller than 30 angstrom. In case of the conventional semiconductor device 700, since the boundary end portion of the semiconductor substrate 10 and the boundary end portion of the gate. electrode 30 are not clearly defined, they were named here the end portion of the semiconductor substrate 10 and the end portion of the gate electrode 30. Therefore, in the semiconductor device 100 according to the instant embodiment, the boundary end portion 15 and the boundary end portion 35 substantially correspond to the end portion of the semiconductor substrate 10 and the end portion of the gate electrode 30, respectively.

Once the boundary end portions 15, 30 are shaped spherical with a curvature radius not smaller than a certain value, concentration of the stress to the boundary end portions 15, 30 can be alleviated. Simultaneously, local concentration of the electric field to the boundary end portions 15, 35 is alleviated.

In the semiconductor device 100 according to the instant embodiment, since the thickness $T_3$ of the silicon oxide film 70$a$ and the thickness $T_4$ of the silicon oxide film 70$b$ are approximately equal, the substrate top surface 12 and the boundary end portion 35 do not overlap, and the opposed surface 12 and the boundary end portion 15 do not overlap, when they are viewed from a direction vertical to the substrate top surface 12. In other words, in a view from a direction vertical to the substrate top surface 12, the boundary end portions 35, 15 appear to overlap.

Because of this configuration, even if the electric field concentrates to the boundary end portions 15, 35, the gate insulating film 20 is unlikely to break, and this feature contributes to improving the production yield of semiconductor devices.

Figure 3:
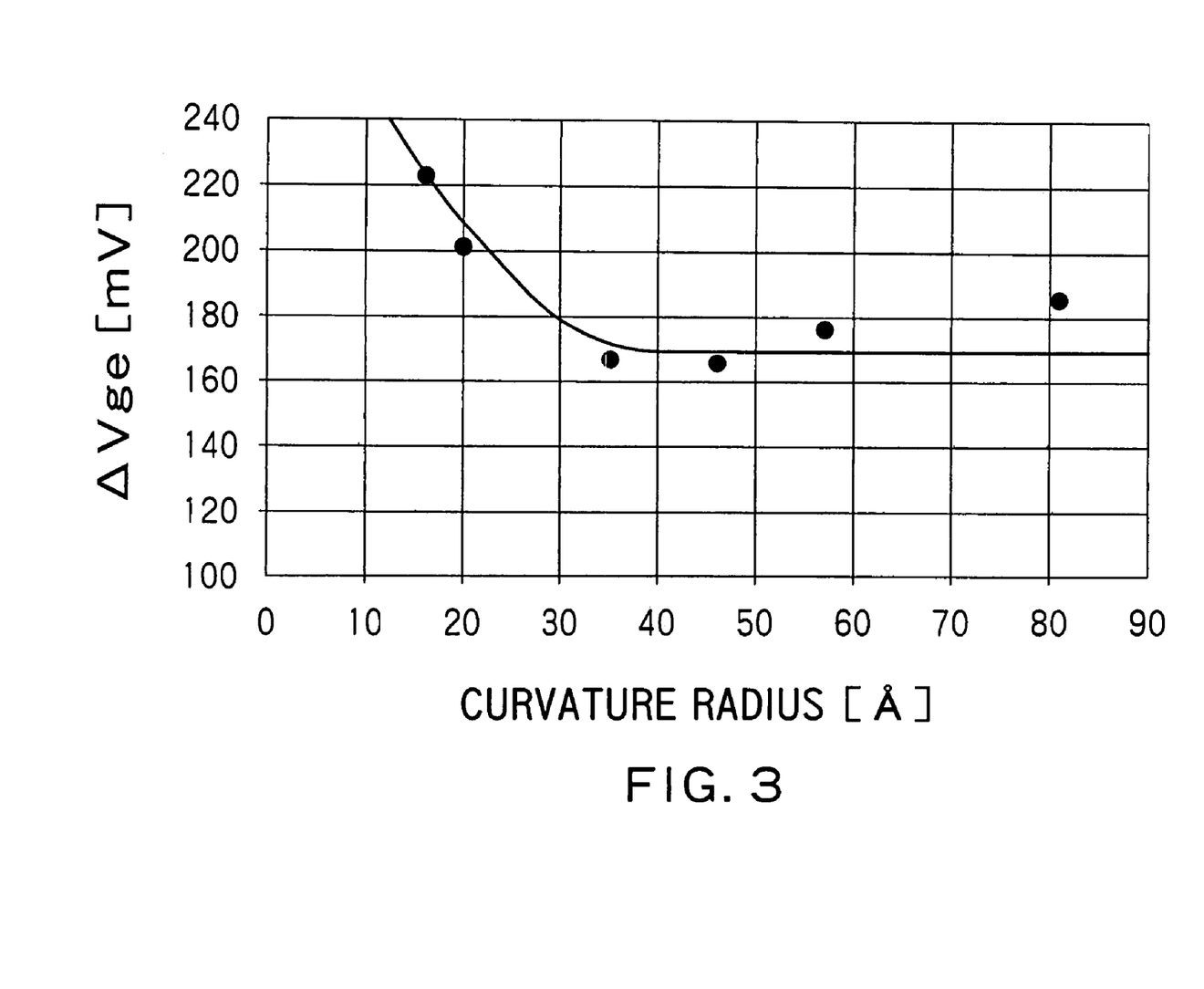
FIG. 3 is a diagram showing a graph that illustrates a relation between the curvature radius of boundary end portions 15, 35 and the variation of trapped electrons ($\Delta$Vge)

FIG. 3 is a diagram showing a graph that illustrates a relation between the curvature radius of boundary end portions 15, 30 and the variation of trapped electrons (ΔVge). ΔVge is the variation of the gate voltage for representation of the variation of the electrons trapped in the gate insulating film 20. This graph shows in actual measurement value the variation of the trapped electrons after applying a constant current stress of 0.1 A/cm$^2$ from the gate electrode 30 to the gate insulating film 20 for 20 seconds and injecting electric charges of approximately 2 C/cm$^2$.

When the boundary end portions 15, 35 have a curvature radius smaller than approximately 30 angstrom, ΔVge is large, and the amount of the trapped electrons is great. When the curvature radius of the boundary end portions 15, 35 is larger than approximately 30 angstrom, ΔVge is small, and the amount of the trapped electrons is small. When the curvature radius exceeds approximately 30 angstrom, the rate of the decrease of ΔVge decelerates. Therefore, when the curvature radius of the boundary end portions 15, 35 are adjusted to be approximately 30 angstrom or more, concentration of the stress and the electric field to the boundary end portions 15, 35 is effectively alleviated.

Figure 4:
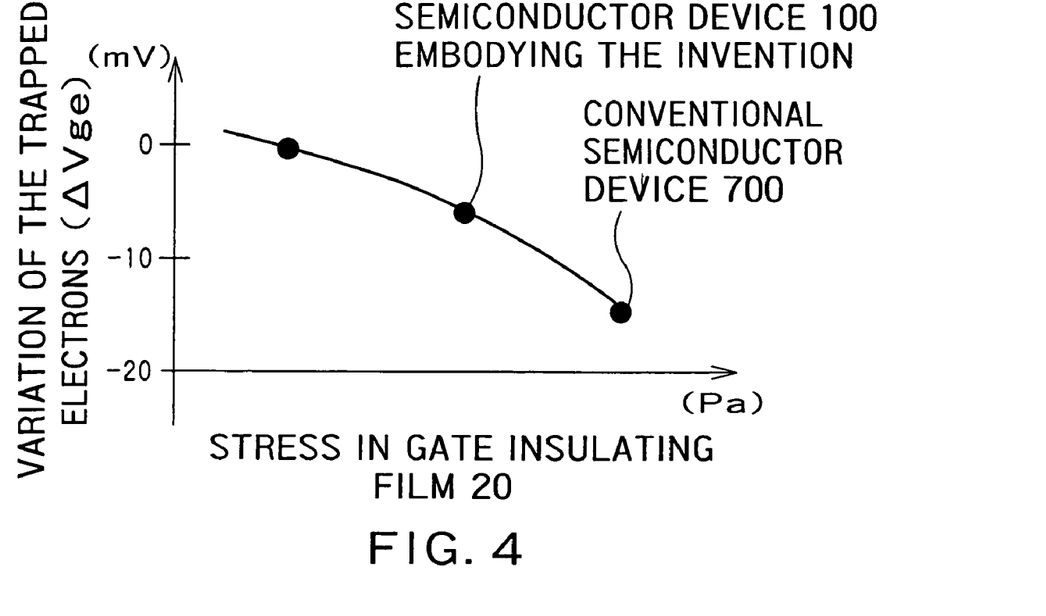
FIG. 4 is a diagram showing a graph that illustrates a relation between the stress in a gate insulating film and the variation of trapped electrons.

FIG. 4 is a diagram showing a graph that illustrates a relation between the stress in a gate insulating film and the amount of the trapped electrons. The abscissa of the graph shown in FIG. 4 represents the stress in the gate insulating film 20 whereas the ordinate represents the variation of the trapped electrons (ΔVge). This graph shows in simulation value the variation of the trapped electrons in each of the conventional semiconductor device 700 and the semiconductor device 100 according to the instant embodiment after applying a constant current stress of 0.1 A/cm² from the gate electrode 30 to the gate insulating film 20 for 20 seconds, and injecting electric charges of approximately 2 C/cm². In FIG. 4, as the stress in the gate electrode 30 decreases, the value ΔVge decreases.

As the difference in thickness between the silicon oxide film 70a and the silicon oxide film 70b increases, the stress of the gate insulting film 20 increases. Further, as the stress to the boundary end portions 15, 35 increases, the stress in the gate insulating film 20 increases. It can therefore be understood that the amount of the trapped electrons in the gate insulating film 20 of the semiconductor device 100 according to the instant embodiment is less than the amount of the trapped electrons in the gate insulating film 20 of the conventional semiconductor device 700.

ΔVge is different in value and sign between FIG. 3 and FIG. 4. This is because FIG. 3 shows ΔVge in experimental value and absolute value but FIG. 4 shows it in simulation value with the plus or minus sign.

Figure 5:
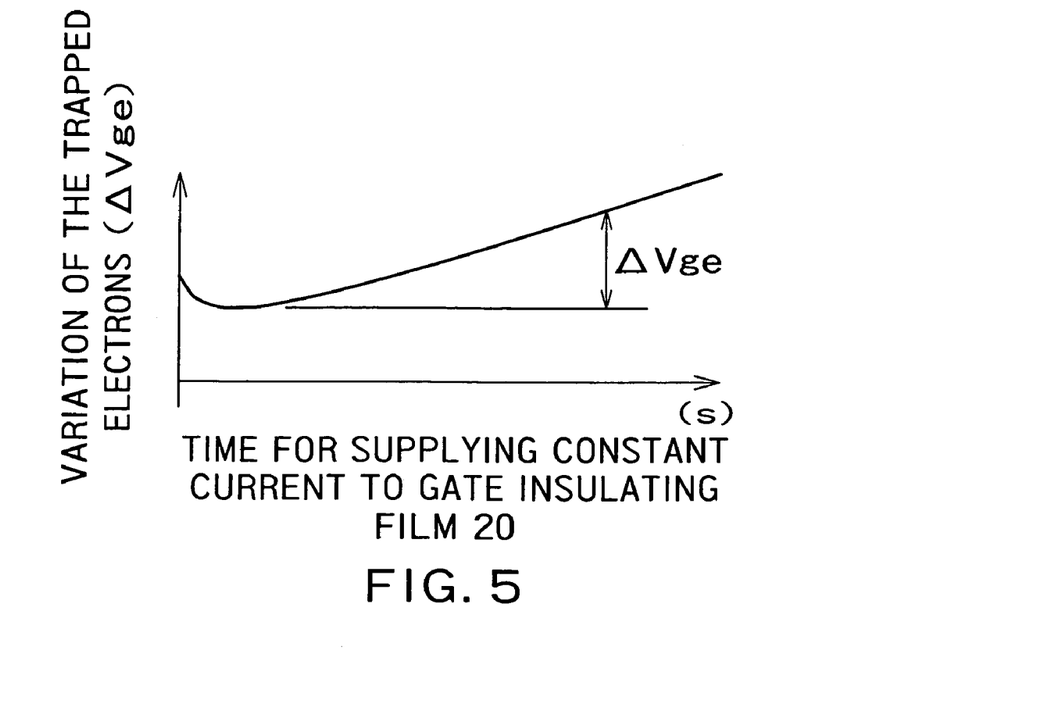
FIG. 5 is a diagram showing a graph that illustrates a relation between the duration of time of the supply of a constant current to the gate insulating film 20 and the variation of traped electrons ($\Delta$Vge)

FIG. 5 is a diagram showing a graph that illustrates a typical relation between the duration of time of the supply of a constant current to the gate insulating film 20 and the variation of the trapped electrons in the gate insulating film 20 (ΔVge). FIG. 5 teaches that the amount of the trapped electrons increases as the duration of time of the supply of a constant current to the gate insulating film 20 becomes longer.

Figure 6:
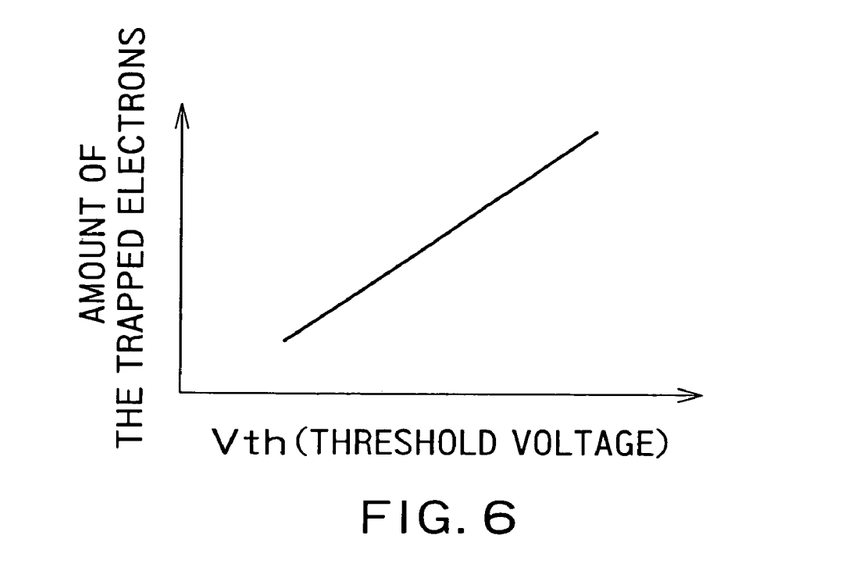
FIG. 6 is a diagram showing a graph that illustrates a relation between the threshold voltage (Vt) of the semiconductor device and the variation of the trapped electrons ($\Delta$Vge) in the gate insulating film 20.

FIG. 6 is a diagram showing a graph that illustrates a typical relation between the threshold voltage (Vt) of the semiconductor device and the variation of the trapped electrons (ΔVge) in the gate insulating film 20. FIG. 6 teaches that the threshold voltage of the semiconductor device changes in proportion to the amount of the trapped electrons.

As compared with the conventional semiconductor device 700, the semiconductor device 100 according to the instant embodiment is less in the amount of electrons (ΔVge) trapped in the gate insulating film 20 (see FIGS. 4 and 5), and therefore smaller in fluctuation of the threshold voltage (see FIG. 6). This means that the semiconductor device 100 is stronger against electrical stress and has a longer lifetime than the semiconductor device 700.

Figure 7:
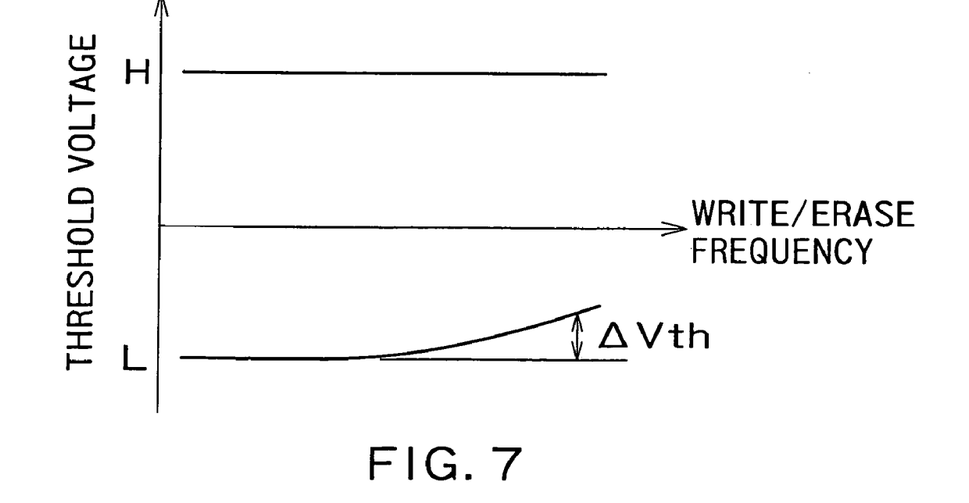
FIG. 7 is a diagram showing a graph that illustrates a relation between the W/E endurance characteristics in a memory of the semiconductor device and the threshold voltage of the semiconductor device.

FIG. 7 is a diagram showing a graph that illustrates a typical relation between the W/E endurance characteristics in a memory of the semiconductor device and the threshold voltage of the semiconductor device. FIG. 7 teaches that, as the Write/Erase frequency increases, the amount of electrons trapped in the gate insulating film 20 increases, and the threshold voltage of the semiconductor device results in fluctuation.

From FIGS. 4 through 6, it is understood that the semiconductor device 100 according to the instant embodiment exhibits a smaller variation of the trapped electrons (Δvge) relative to the constant current stress than that of the conventional semiconductor device 700. Therefore, in a nonvolatile semiconductor storage device using the gate electrode 30 as its floating gate electrode, the semiconductor device 100 according to the instant embodiment will operate with a smaller variation of the trapped electrons (ΔVge) and smaller fluctuation of the threshold voltage even over more frequent Write/Erase actions than the conventional semiconductor device 700. Furthermore, even if operated for Write/Erase more frequently, the semiconductor device 100 can hold electric charges in the gate electrode 30 as the floating gate electrode for a longer period of time than the semiconductor device 700.

Although the explanation with reference to FIGS. 4 through 7 has been made in conjunction with the trapped electrons, it is similarly applicable also to the trapped holes.

The semiconductor device according to the instant embodiment as explained above ensures that since the stress and the electric field do not concentrate at end portions of the semiconductor substrate and the amorphous silicon film, the trapped electrons are fewer and the resistance to voltage of the gate is relatively higher than the conventional semiconductor device.

The manufacturing method of a semiconductor device according to an embodiment the invention can manufacture a semiconductor device in which since a stress and an electric field do not concentrate at the end portions of the semiconductor substrate and the amorphous silicon film, the trapped electrons are fewer and the resistance to voltage of the gate is relatively higher than the conventional method.

What is claimed is:

1. A semiconductor device comprising:
   a semiconductor substrate having a substrate top surface on which a device should be formed,
   a gate electrode having an opposed surface opposed to said substrate top surface, and electrically insulated from said semiconductor substrate by a gate insulating film,
   a trench formed through said gate electrode into said semiconductor substrate to electrically isolate a device region for forming a device from the remainder region of said substrate top surface,
   a first boundary end portion, which is defined between a substrate side surface of said semiconductor substrate forming a part of the side surface of said trench and said substrate top surface, and
   a second boundary end portion, which is defined between a gate side surface of said gate electrode forming another part of the side surface of said trench and said opposed surface,
   wherein said first boundary end portion and said second boundary end portion have spherical shapes having a curvature radius not smaller than 30 angstroms.

2. A semiconductor device according to claim 1 wherein an oxide film formed on said substrate side surface and an oxide film formed on said gate side surface are substantially equal in thickness on both said substrate side surface and said gate side surface.

3. A semiconductor device according to claim 1 wherein said gate electrode is a floating gate electrode electrically insulated around it.

4. A semiconductor device according to claim 3 further comprising a nonvolatile semiconductor storage device including said floating gate electrode.

* * * * *